(12) United States Patent  
Lynch et al.

(10) Patent No.: US 11,864,337 B1  
(45) Date of Patent: Jan. 2, 2024

(54) HUB DEVICE FOR PORTABLE ELECTRONIC DEVICE

(71) Applicant: Pioneer Square Brands, Inc., Seattle, WA (US)

(72) Inventors: Riley Edwin Lynch, Greensboro, NC (US); Sudeep Balkrishna Agalgaonkar, Jamestown, NC (US)

(73) Assignee: Pioneer Square Brands, Inc., High Point, NC (US)

( * ) Notice: Subject to any disclaimer, the term of this patent is extended or adjusted under 35 U.S.C. 154(b) by 0 days.

(21) Appl. No.: 18/234,028

(22) Filed: Aug. 15, 2023

Related U.S. Application Data

(63) Continuation-in-part of application No. 18/224,528, filed on Jul. 20, 2023, now Pat. No. 11,805,873.

(51) Int. Cl.
H05K 7/02 (2006.01)
H05K 5/02 (2006.01)

(52) U.S. Cl.
CPC ........... *H05K 7/026* (2013.01); *H05K 5/0234* (2013.01)

(58) Field of Classification Search
None
See application file for complete search history.

(56) References Cited

U.S. PATENT DOCUMENTS

| | | | | |
|---|---|---|---|---|
| 6,078,504 A | * | 6/2000 | Miles | G06F 1/184 361/752 |
| 6,678,535 B1 | * | 1/2004 | Narayanaswami | H04L 69/08 370/466 |
| 7,108,559 B2 | * | 9/2006 | Shtargot | H01R 12/722 439/69 |
| 7,721,962 B2 | * | 5/2010 | Moon | H01R 13/629 235/441 |
| 8,638,551 B2 | * | 1/2014 | Tsai | G06K 7/0004 361/679.4 |
| 9,585,270 B2 | * | 2/2017 | Yang | G06F 1/18 |
| 9,958,909 B1 | * | 5/2018 | Sporer | G06F 1/181 |
| 11,291,127 B2 | * | 3/2022 | Huang | G05G 1/02 |
| 2008/0194121 A1 | * | 8/2008 | Chang | G06F 1/1632 439/59 |
| 2010/0078470 A1 | * | 4/2010 | DalPorto | G11B 33/128 235/375 |
| 2014/0111934 A1 | * | 4/2014 | Chang | G06F 13/382 361/679.41 |

* cited by examiner

*Primary Examiner* — Xanthia C Relford
(74) *Attorney, Agent, or Firm* — Grandview Law

(57) ABSTRACT

Systems involve implementations including an electronic hub device with electronic device interface ports and with protrusions for coupling with a base assembly of a stand system wherein the electronic hub device is positioned in an internal cavity of the base assembly when the electronic hub device is coupled to the base assembly. Other aspects are described in the claims, drawings, and text forming a part of the present disclosure.

18 Claims, 17 Drawing Sheets

HUB DEVICE FOR PORTABLE ELECTRONIC DEVICE

SUMMARY

In one or more aspects an electronic hub device system for a portable electronic device, the electronic hub device system including (I) at least one first electronic device interface port; (II) a first side including a first edge and a second edge, the first side extending between the first edge and the second edge; (III) a first exterior surface portion extending perpendicular to the first side and extending to the first edge of the first side, and (IV) at least one first protrusion extending away from the first side in a direction parallel to the first exterior surface portion, the at least one first protrusion being closer to the first edge of the first side than to the second edge of the first side. Wherein the at least one first protrusion includes a first surface portion with a first elevation, and wherein the first exterior surface portion includes an elevation equal to the first elevation of the first surface portion of the at least one first protrusion. Wherein the first exterior surface portion is planar, wherein the at least one first protrusion includes a first surface portion that is planar, and wherein the first exterior surface portion and the first surface portion of the at least one protrusion are coplanar. Further including at least one second electronic device interface port including an opening facing in a first direction, wherein the at least one first electronic device interface port includes an opening facing in a second direction, and wherein the first direction is opposite of the second direction. Further including a fastener with an elongated portion, wherein the at least one protrusion includes an aperture shaped to receive the fastener with its elongated portion oriented with respect to a direction being parallel to the first side. Wherein the first exterior surface portion includes a rectangular shape. Further including a second side and at least one second protrusion, wherein the second side includes a first edge and a second edge, wherein the first exterior surface portion extends between the first edge of the first side and the first edge of the second side, and wherein the at least one second protrusion extends away from the second side in a direction parallel to the first exterior surface portion, the at least one second protrusion being closer to the first edge of the second side than to the second edge of the second side. Wherein the at least one first protrusion includes an aperture with a central aperture location, wherein the at least one second protrusion includes an aperture with a central aperture location, wherein the central aperture location of the first protrusion is perpendicularly spaced away from the first side along a first linear direction, wherein the central aperture location of the second protrusion is perpendicularly spaced away from the second side along a second linear direction, and wherein the first linear direction and the second linear direction are colinear. Further including at least one second protrusion, wherein the at least one second protrusion extends away from the first side in a direction parallel to the first exterior surface, the at least one second protrusion being closer to the first edge of the first side than to the second edge of the first side, wherein the first side includes a third edge perpendicular to the first edge and a fourth edge perpendicular to the first edge, wherein the first side extends between the third edge and the fourth edge, wherein the at least one first protrusion is located closer to the third edge than being located to the at least one second protrusion, and wherein the at least one second protrusion is located closer to the fourth edge than being located to the at least one first protrusion.

In one or more aspects a stand system for a portable electronic device, the stand system including (I) a base assembly including (A) a lower assembly including a first exterior end, a second exterior end, a first exterior side, a second exterior side, and an interior cavity wherein the interior cavity includes a first interior end, a second interior end, a first interior side, a second interior side, an upper opening and a lower opening, and (B) an upper assembly including an exterior face, the upper assembly being couplable with the lower assembly wherein the upper assembly covers at least the upper opening of the interior cavity of the lower assembly when the upper assembly is coupled to the lower assembly, (II) a wall assembly including an exterior face, the wall assembly couplable to the first end of the lower assembly, and (III) a portable electronic device support assembly extending perpendicularly with respect to the exterior face of the wall assembly. Wherein the lower assembly of the base assembly further includes a passageway, and wherein the passageway runs from the interior cavity of the lower assembly through the first interior side of the interior cavity and through the first exterior side of the lower assembly. Wherein the lower assembly of the base assembly further includes a passageway, and wherein the passageway runs from the interior cavity of the lower assembly through the second interior end of the interior cavity and through the second exterior end of the lower assembly. Further including a first electronic device interface port, wherein the first electronic device interface port is coupled to the exterior face of the wall portion of the wall assembly. Further including a second electronic device interface port, wherein the second electronic device interface port is coupled to the first interior end of the interior cavity, and wherein the second electronic device interface port is coupled to the first electronic interface port via electrical cabling. Wherein the first interior side of the interior cavity includes an interior recess including at least one threaded aperture, and wherein the second interior side of the interior cavity includes an interior recess including at least one threaded aperture.

In one or more aspects a system for a portable electronic device, the system including an electronic hub device system including (I) at least one first electronic device interface port, (II) a first side including a first edge and a second edge, the first side extending between the first edge and the second edge, (III) a first exterior surface portion extending perpendicular to the first side and extending to the first edge of the first side, and (IV) at least one first protrusion extending away from the first side in a direction parallel to the first exterior surface, the at least one first protrusion being closer to the first edge of the first side than to the second edge of the first side; and a stand system including (I) a base assembly including (A) a lower assembly including a first exterior end, a second exterior end, a first exterior side, a second exterior side, and an interior cavity wherein the interior cavity includes a first interior end, a second interior end, a first interior side, a second interior side, an upper opening and a lower opening, (II) a wall assembly including an exterior face, the wall assembly couplable to the first end of the lower assembly, and (III) a portable electronic device support assembly extending perpendicularly with respect to the exterior face of the wall assembly; wherein the electronic hub device system is couplable to the lower assembly of the base assembly of the stand system, and wherein the electronic hub device system is positioned in the interior cavity of the lower assembly when the electronic hub device system is coupled thereto. Wherein the at least one protrusion of the electronic hub device system includes an aperture shaped to receive a fastener elongated along an axis parallel to the first side of the electronic hub device system, wherein the fastener couples the electronic hub device system to the lower assembly of the stand system when the electronic hub device system is coupled to the lower assembly. Wherein the first interior side of the interior cavity of the lower assembly of the stand system includes an interior recess including at least one threaded aperture, wherein the at least one protrusion of the electronic hub device system includes an aperture, and wherein the at least one protrusion is positioned in the interior recess to align the aperture of the at least one protrusion with the at least one threaded aperture of the interior recess of the first interior side of the interior cavity when the electronic hub device system is coupled to the lower assembly of the base assembly of the stand system. Further including a first electronic device interface port, wherein the first electronic device interface port is coupled to the exterior face of the wall assembly. Further including a second electronic device interface port, wherein the second electronic device interface port is coupled to the first end of the interior cavity of the lower assembly, wherein the second electronic device interface port is coupled to the first electronic device interface port via electrical cabling, and wherein the second electronic device interface port is coupled to the electronic hub device system when the electronic hub device system is coupled to the lower assembly of the base assembly of the stand system.

In addition to the foregoing, other aspects are described in the claims, drawings, and text forming a part of the disclosure set forth herein. Various other aspects are set forth and described in the teachings such as text (e.g., claims and/or detailed description) and/or drawings of the present disclosure. The foregoing is a summary and thus may contain simplifications, generalizations, inclusions, or omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

BRIEF DESCRIPTION OF THE FIGURES

For a more complete understanding of implementations, reference now is made to the following descriptions taken in connection with the accompanying drawings. The use of the same symbols in different drawings typically indicates similar or identical items, unless context dictates otherwise.

With reference now to the figures, shown are one or more examples of Hub Device for Portable Electronic Device, articles of manufacture, compositions of matter for same that may provide context, for instance, in introducing one or more processes and/or devices described herein.

DETAILED DESCRIPTION

Figure 1:
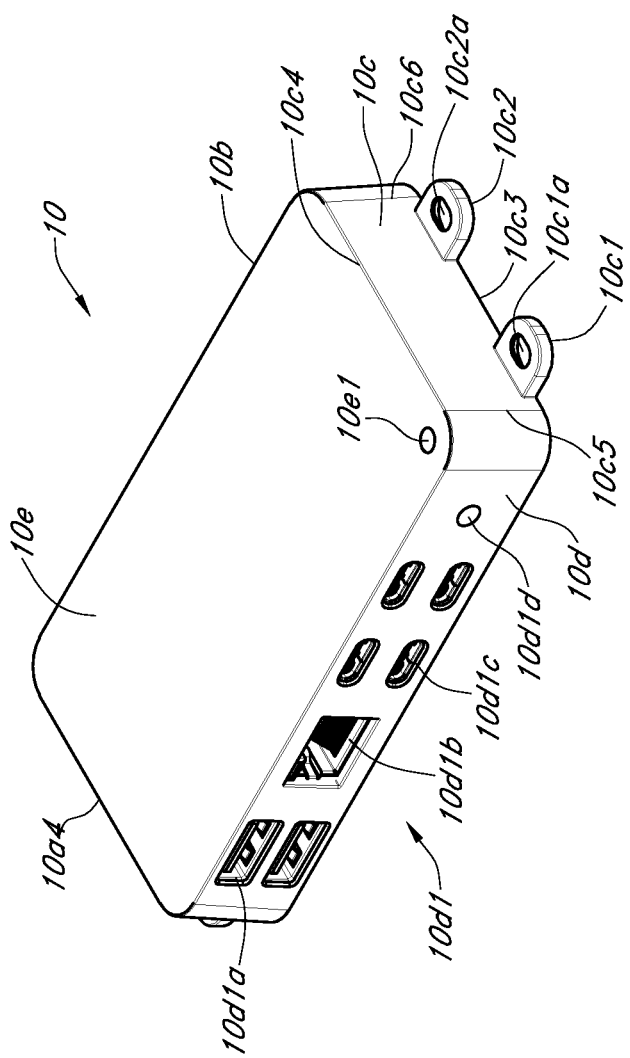
FIG. 1 is a rear-top perspective of a hub device.

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here.

Turning to FIG. 1, depicted therein is a rear-top perspective of electronic hub device 10. Depicted implementation of electronic hub device 10 is shown to include edge side 10$b$, side 10$c$, side 10$d$, and exterior surface portion 10$e$. Depicted implementation of side 10$c$ is shown to include protrusion 10$c$1 with aperture 10$c$1$a$, protrusion 10$c$2 with aperture 10$c$2$a$. Depicted implementation of side 10$c$ is shown to include edge 10$c$3, edge 10$c$4, edge 10$c$5 and edge 10$c$6.

As depicted, side 10$c$ is shown to extend between edge 10$c$3 and edge 10$c$4 and extend between edge 10$c$4 and edge 10$c$5. As depicted exterior surface portion 10$e$ is shown to extend between edge 10$a$4 and edge 10$c$4 and to extend perpendicularly to side 10$c$. As depicted exterior surface portion 10$e$ is shown to be rectangular in shape. As depicted protrusion 10$c$1 is shown extending away from side 10$c$ in a direction parallel to exterior surface portion 10$e$. As depicted protrusion 10$c$1 is shown to be closer to edge 10$c$5 than to edge 10$c$6 and than to protrusion 10$c$2. As depicted protrusion 10$c$2 is shown extending away from side 10$c$ in a direction parallel to exterior surface portion 10$e$. As depicted protrusion 10c2 is shown to be closer to edge 10c6 than to edge 10c5 and than to protrusion 10c1.

Depicted implementation of side 10d is shown to include electronic device interface ports 10d1 with usb port 10d1a, ethernet port 10d1b, usb-c port 10d1c, and electrical power port 10d1d all with openings facing in a first direction. Depicted implementation of exterior surface portion 10e is shown to include power indicator 10e1.

Figure 2:
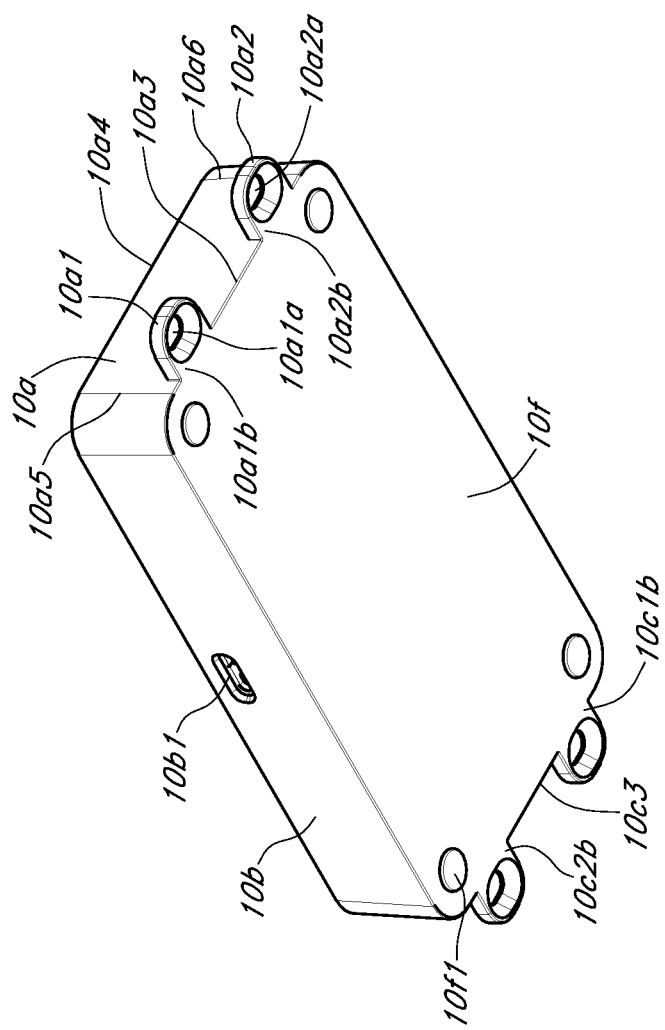
FIG. 2 is a front-bottom perspective view of the hub device of FIG. 1.

Turning to FIG. 2, depicted therein is a front-bottom perspective view of electronic hub device 10. Depicted implementation of electronic hub device 10 is shown to include side 10a. Depicted implementation of side 10a is shown to include protrusion 10a1 with aperture 10a1a and surface portion 10a1b, protrusion 10a2 with aperture 10a2a and surface portion 10a2b. Depicted implementation of side 10a is shown to include edge 10a3, edge and edge 10a5, and edge 10a6. As depicted side 10a is shown to extend between edge and edge 10a4 and to extend between edge 10a5, and edge 10a6.

Depicted implementation of side 10b is shown to include electronic device interface port 10b1 with an opening facing in a second direction. Depicted implementation of protrusion 10c1 is shown to include surface portion 10c1b. Depicted implementation of protrusion 10c2 is shown to include surface portion 10c2b. Depicted implementation of electronic hub device 10 is shown to include exterior surface portion 10f with foot pad 10f1.

As depicted exterior surface portion 10f is shown to extend between edge 10a3 and edge 10c3 and to extend perpendicularly to side 10a. As depicted exterior surface portion is shown to be rectangular in shape.

As depicted protrusion 10a1 is shown extending away from side 10a in a direction parallel to exterior surface portion 10f. As depicted protrusion 10a1 is shown to be closer to edge 10a5 than to edge 10a6 and than to protrusion 10a2. As depicted protrusion 10a2 is shown extending away from side 10a in a direction parallel to exterior surface portion 10f. As depicted protrusion 10a2 is shown to be closer to edge 10a6 than to edge 10a5 and than to protrusion 10a1.

As depicted surface portion 10a1b, surface portion 10a2b, surface portion 10c1b, and surface portion 10c2b are shown to be planar with the same elevation as exterior surface portion 10f, which is also planar so is also coplanar with surface portion 10a1b, surface portion 10a2b, surface portion 10c1b, and surface portion 10c2b.

Figure 3:
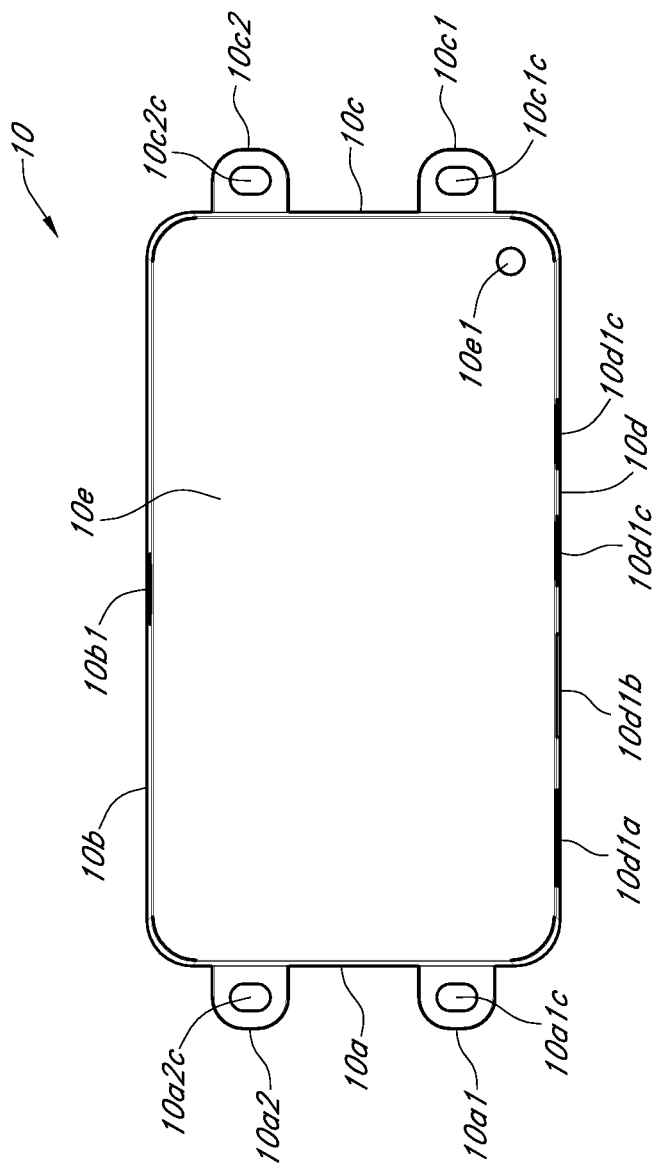
FIG. 3 is a top-plan view of the hub device of FIG. 1.

Turning to FIG. 3, depicted therein is a top-plan view of electronic hub device 10. Depicted implementation of protrusion 10a1 is shown to include central aperture location Depicted implementation of protrusion 10a2 is shown to include central aperture location 10a2c. Depicted implementation of protrusion 10c1 is shown to include central aperture location 10c1c. Depicted implementation of protrusion 10c2 is shown to include central aperture location 10c2c.

As depicted the first direction of the openings of usb port 10d1a, ethernet port 1b, usb-c port 10d1c face in a direction opposite than the direction of the second direction that the opening of electronic device interface port 10b1 faces. As depicted central aperture location 10a2c is perpendicularly spaced away from side 10a along a first linear direction and central aperture location 10c2c is perpendicularly spaced away from side 10c along a second linear direction in which the first linear direction is colinear with the second linear direction. As depicted central aperture location 10a1c is perpendicularly spaced away from side 10a along a first linear direction and central aperture location 10c1c is perpendicularly spaced away from side 10c along a second linear direction in which the first linear direction is colinear with the second linear direction.

Figure 4:
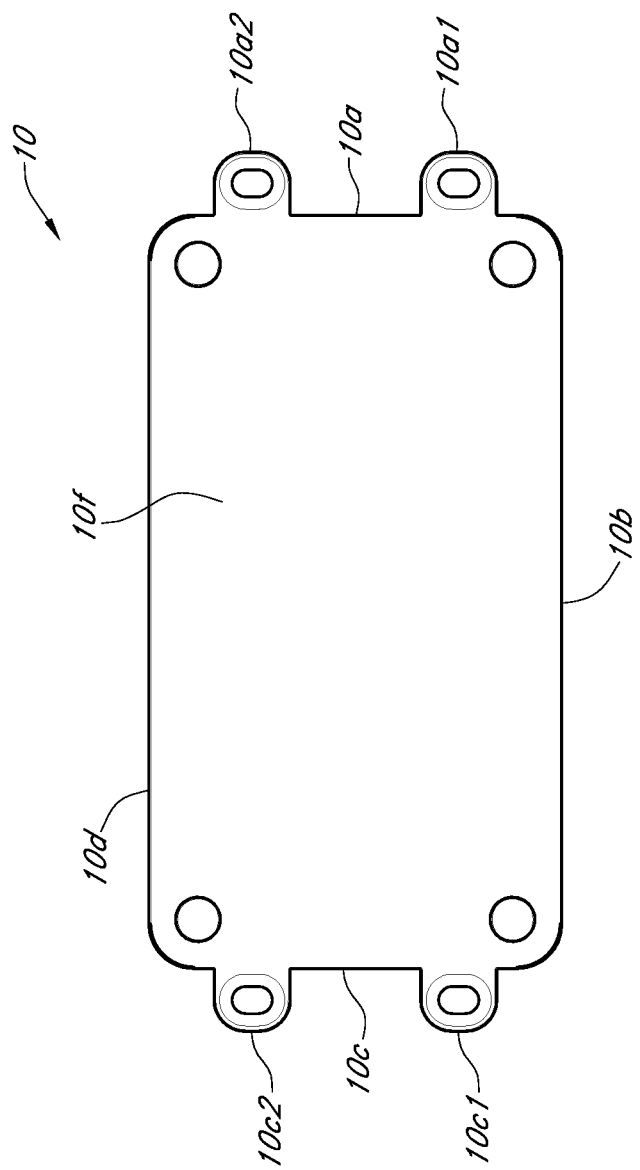
FIG. 4 is a bottom-plan view of the hub device of FIG. 1.

Turning to FIG. 4, depicted therein is a bottom-plan view of electronic hub device 10.

Figure 5:
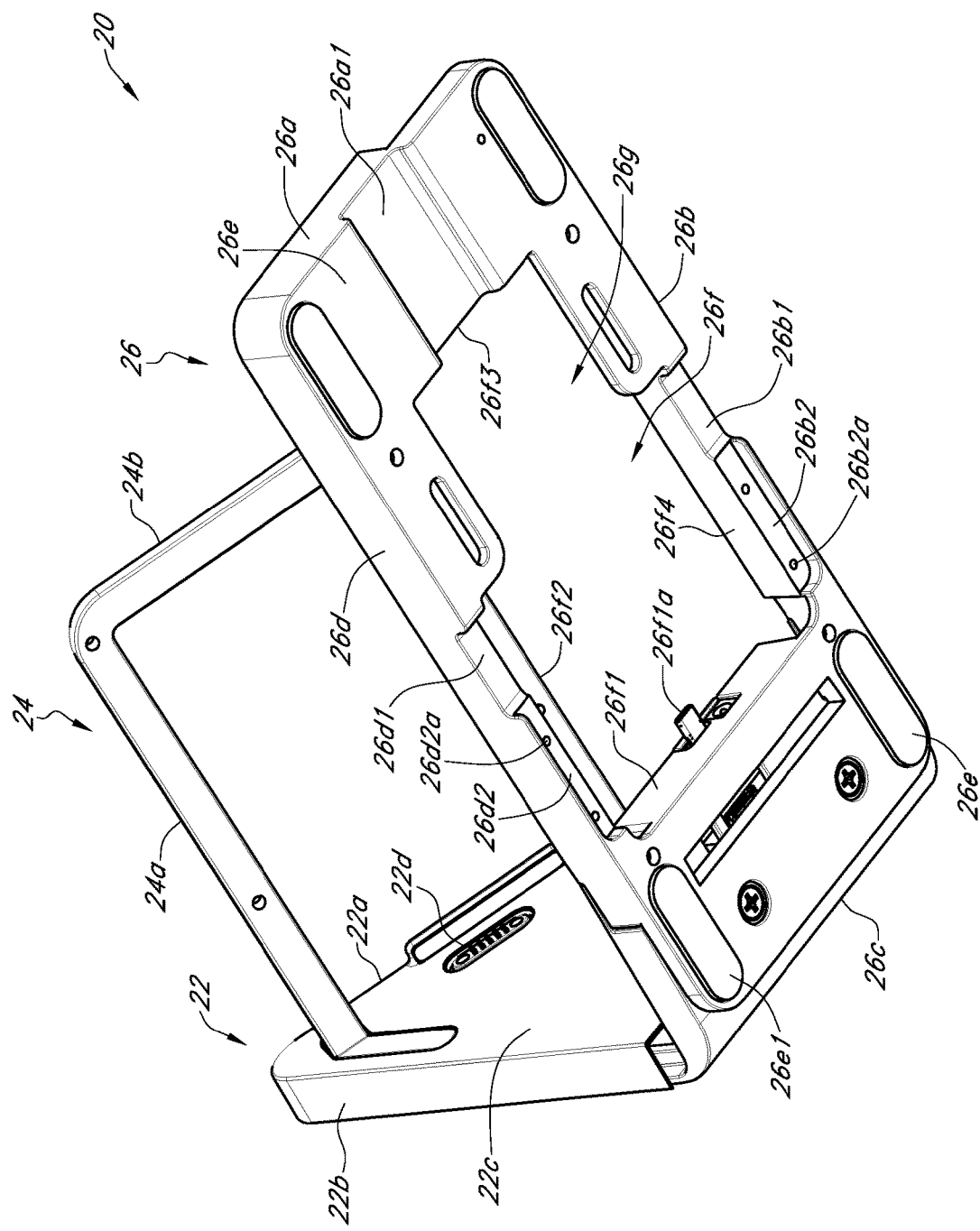
FIG. 5 is a front-bottom perspective partial view of a stand assembly.

Turning to FIG. 5, depicted therein is a front-bottom perspective partial view of portable electronic device stand 20. Depicted implementation of portable electronic device stand 20 is shown to include wall assembly 22, portable electronic device support assembly 24, and lower assembly 26. Depicted implementation of wall assembly 22 is shown to include side 22a, side 22b, exterior face 22c, and electronic device interface port 22d (for coupling with electrical power and/or electronic communication of a portable electronic device or its accessory implementations such as coupled through pogo pin contact implementations of electronic device interface port 22d).

Depicted implementation of portable electronic device support assembly 24 includes side 24a, and crosspiece 24b. Depicted implementation of lower assembly 26 includes exterior end 26a with passageway 26a1, exterior side 26b with passageway 26b1 and recess 26b2 with aperture 26b2a (threaded in implementations), and exterior end 26c. Depicted implementation of lower assembly 26 includes exterior side 26d with passageway 26d1, and recess 26d2 with aperture 26d2a (threaded in implementations), and exterior bottom surface 26e.

Depicted implementation of lower assembly 26 includes interior cavity 26f with interior end 26f1, electronic interface port 26f1a, interior side 26f2, interior end 26f3, and interior side 26f4. Depicted implementation of lower assembly 26 is shown to include upper opening 26g. Although not shown, in implementations electronic interface port 26f1a is coupled to electronic device interface port 22d via electrical cabling being internally position within interiors of wall assembly 22 and lower assembly 26. In implementations electronic interface port 26f1a couples to electronic device interface port 10b1 when lower assembly 26 is coupled with electronic hub device 10 which results in electronic device interface port 22d being coupled with electronic device interface ports 10d1.

Figure 6:
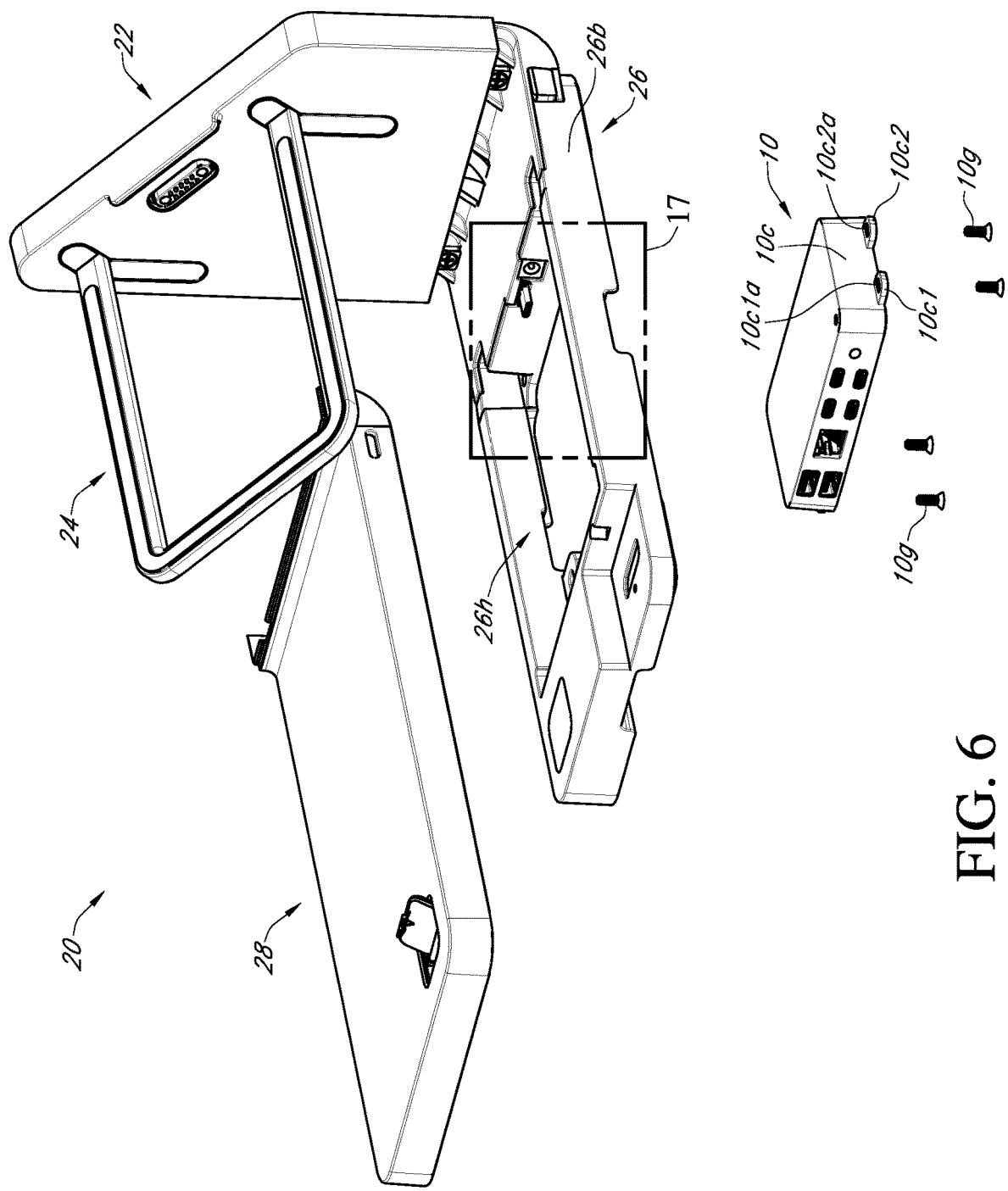
FIG. 6 is a rear-top perspective of the hub device of FIG. 1 and an exploded front-top perspective complete view of the stand assembly partially shown in FIG. 5.

Turning to FIG. 6, depicted therein is a rear-top perspective of electronic hub device 10 and an exploded front-top perspective complete view of portable electronic device stand 20. Depicted implementation of electronic hub device 10 is shown to include fastener 10g (such as screw, bolt, peg, etc.). Depicted implementation of lower assembly 26 is shown to include lower opening 26h. Depicted implementation of portable electronic device stand is shown to include upper assembly 28. As depicted aperture 10c1a of protrusion 10c1 and aperture 10c2a of protrusion 10c2 are oriented to receive fastener 10g with its elongated portion oriented with respect to a direction being parallel to side 10c.

Figure 7:
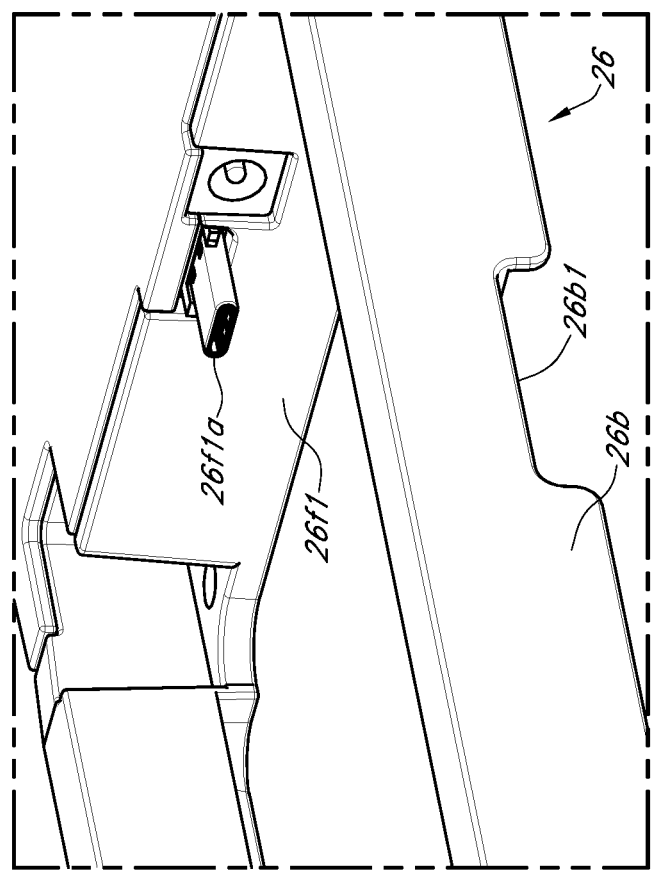
FIG. 7 is an enlarged view of a portion of the stand assembly taken along the "7" dashed-line area of FIG. 6.

Turning to FIG. 7, depicted therein is an enlarged view of a portion of portable electronic device stand 20 taken along the "7" dashed-line area of FIG. 6

Figure 8:
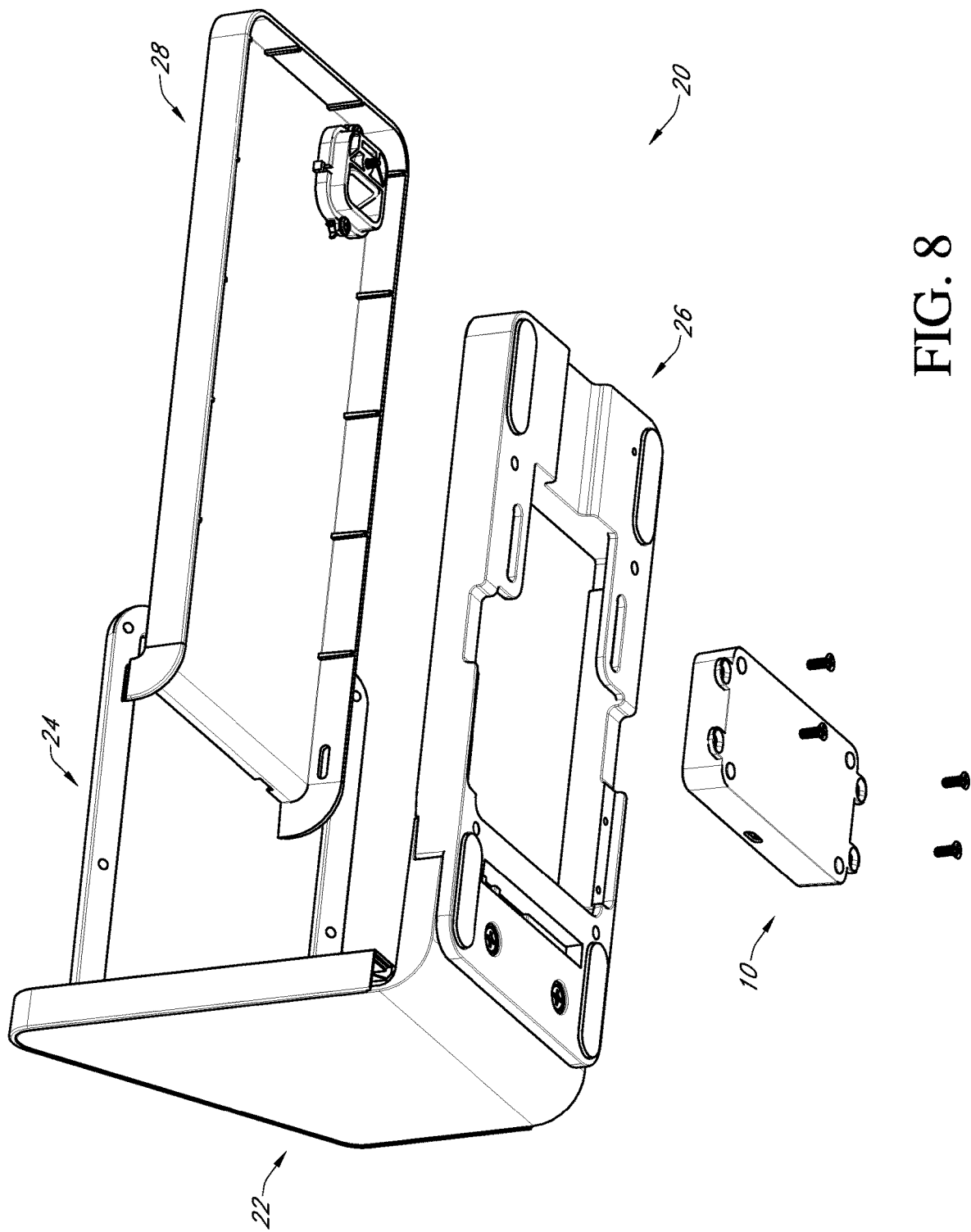
FIG. 8 is a front-bottom perspective view of the hub device of FIG. 1 and an exploded rear-bottom perspective view of the stand assembly of FIG. 6.

Turning to FIG. 8, depicted therein is a front-bottom perspective view of electronic hub device 10 and an exploded rear-bottom perspective view of portable electronic device stand 20.

Figure 9:
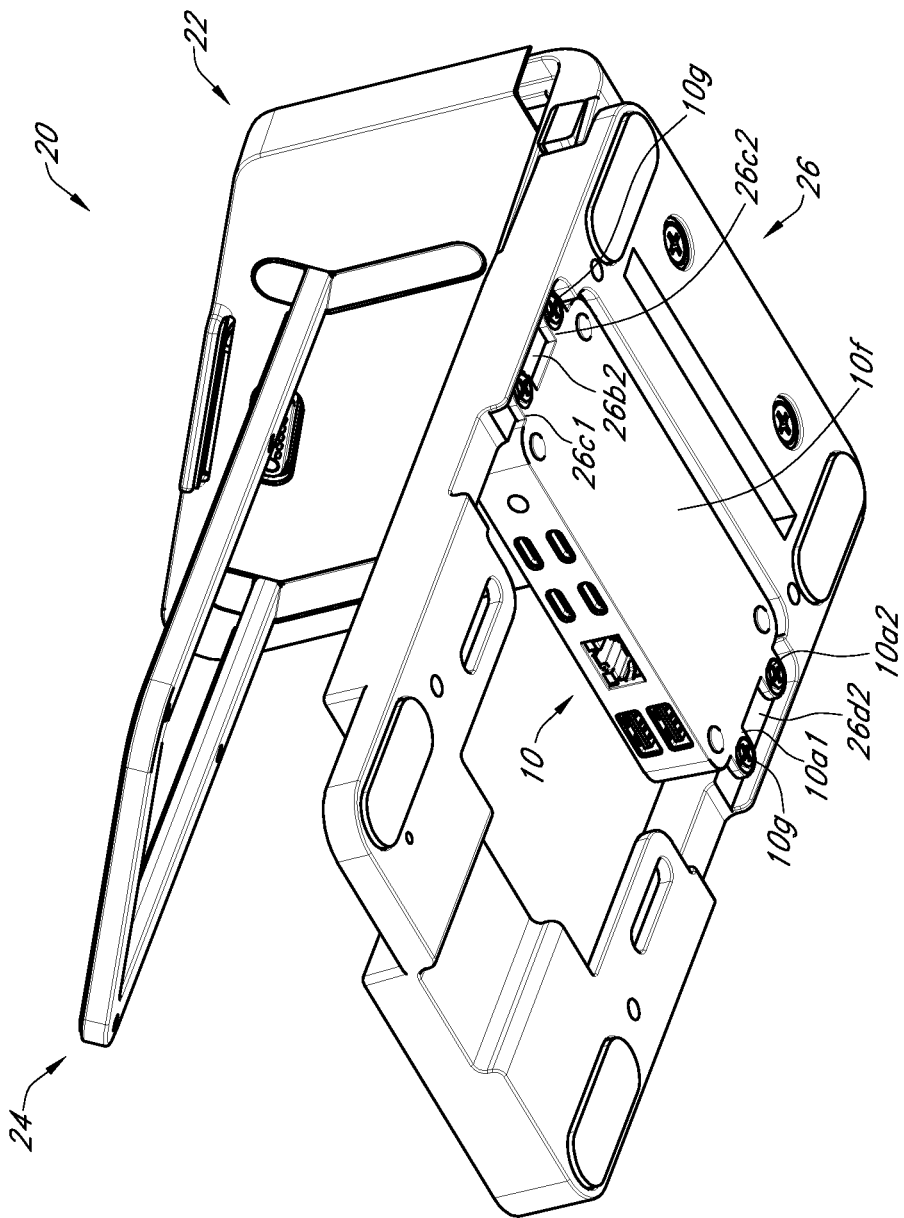
FIG. 9 is a rear-bottom perspective view of the hub device of FIG. 1 coupled with the stand assembly of FIG. 6 shown as a front-bottom perspective partial view of the stand assembly.

Turning to FIG. 9, depicted therein is a rear-bottom perspective view of electronic hub device 10 coupled with portable electronic device stand 20 shown as a front-bottom perspective partial view. As depicted electronic hub device 10 is positioned inside of interior cavity 26f. As depicted protrusion 10a1 and protrusion 10a2 are shown positioned in recess 26d2 with fastener 10g coupled with aperture 26d2a. As depicted protrusion 10c1 and protrusion 10c2 are shown positioned in recess 26b2 with fastener 10g coupled with aperture 26b2a.

Figure 10:
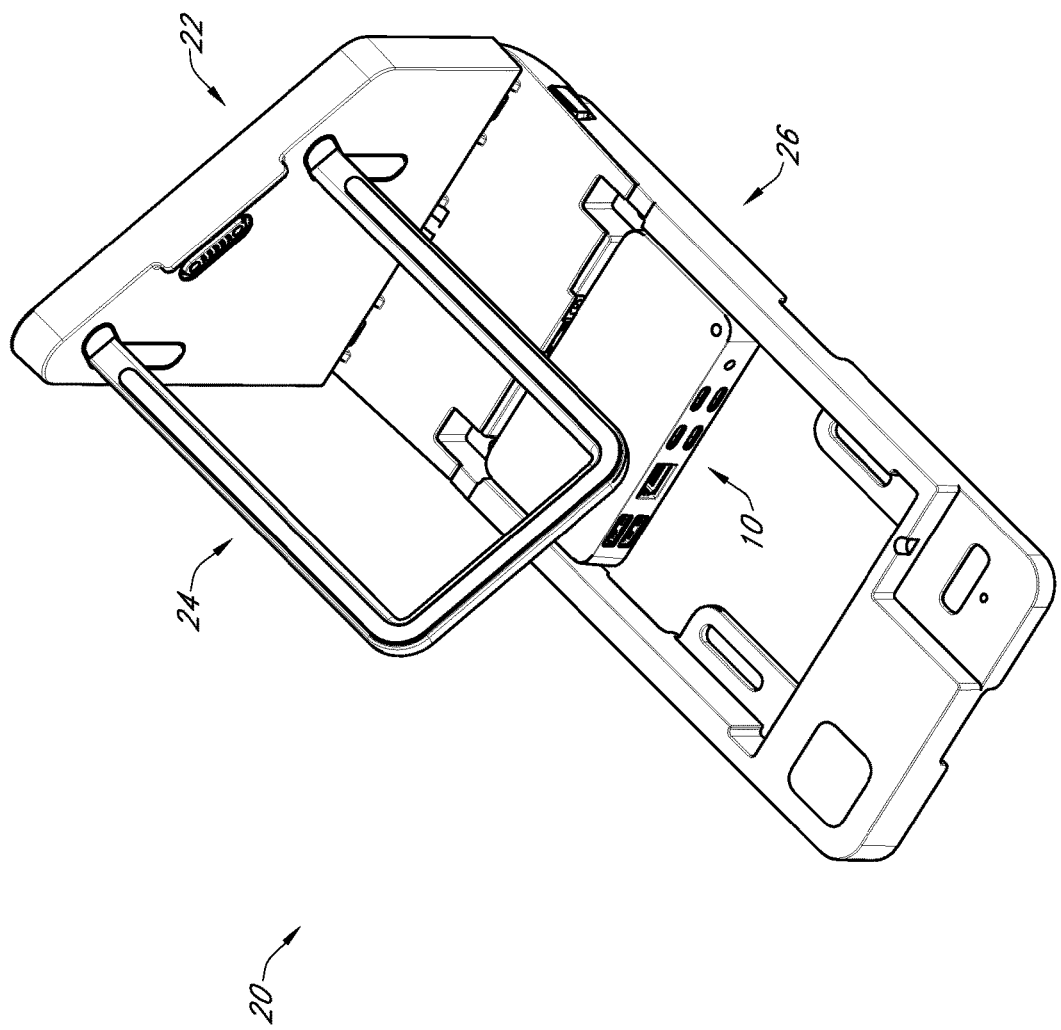
FIG. 10 is a rear-top perspective view of the hub device of FIG. 1 coupled with the stand assembly of FIG. 6 shown as a front-top perspective partial view of the stand assembly.

Turning to FIG. 10, depicted therein is a rear-top perspective view of electronic hub device 10 coupled with portable electronic device stand 20 shown as a front-top perspective partial view.

Figure 11:
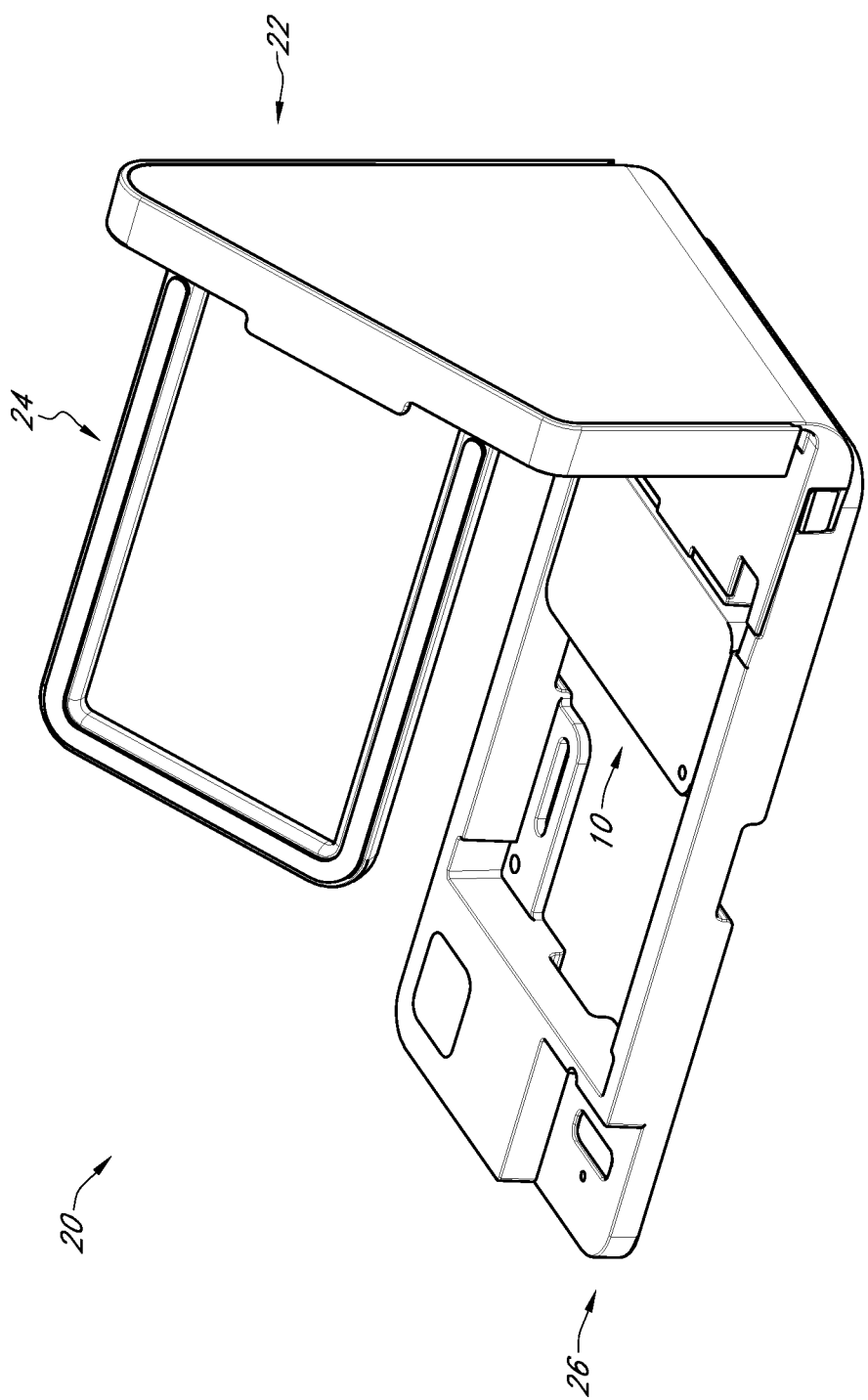
FIG. 11 is a front-top perspective view of the hub device of FIG. 1 coupled with the stand assembly of FIG. 6 shown as a front-bottom perspective partial view of the stand assembly.

Turning to FIG. 11, depicted therein is a front-top perspective view of electronic hub device 10 coupled with portable electronic device stand 20 shown as a front-bottom perspective partial view.

Figure 12:
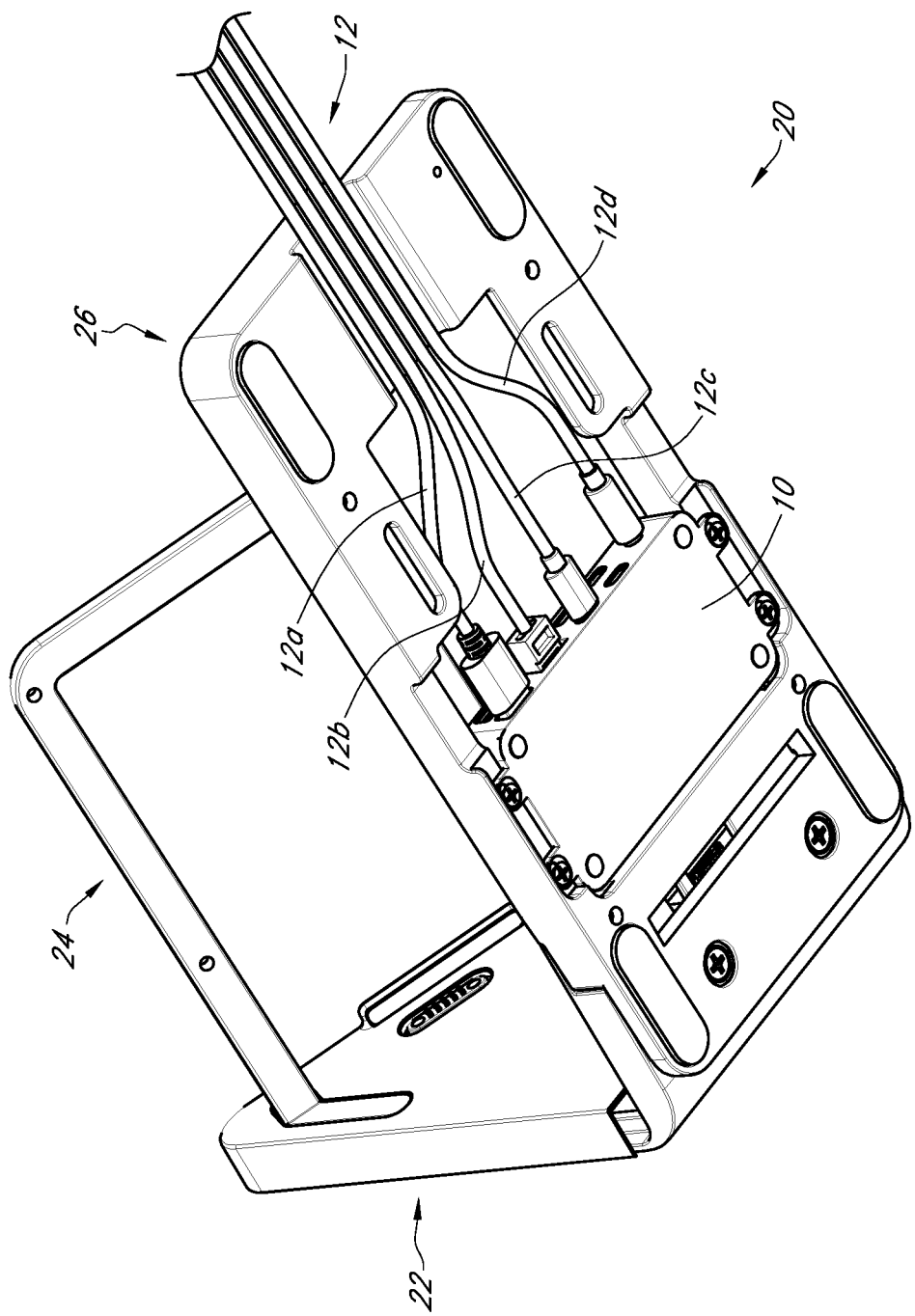
FIG. 12 is a rear-bottom perspective view of the hub device of FIG. 1 coupled with the stand assembly of FIG. 6 shown as a front-bottom perspective partial view of the stand assembly.

Turning to FIG. 12, depicted therein is a rear-bottom perspective view of electronic hub device 10 coupled with portable electronic device stand 20 shown as a front-bottom perspective partial view with electronic hub device 10 shown coupled with cabling bundle 12. Depicted implementation of cabling bundle 12 is shown to include usb cable 12a, ethernet cable 12b, usb-c cable 12c, and electrical power cable 12d.

Figure 13:
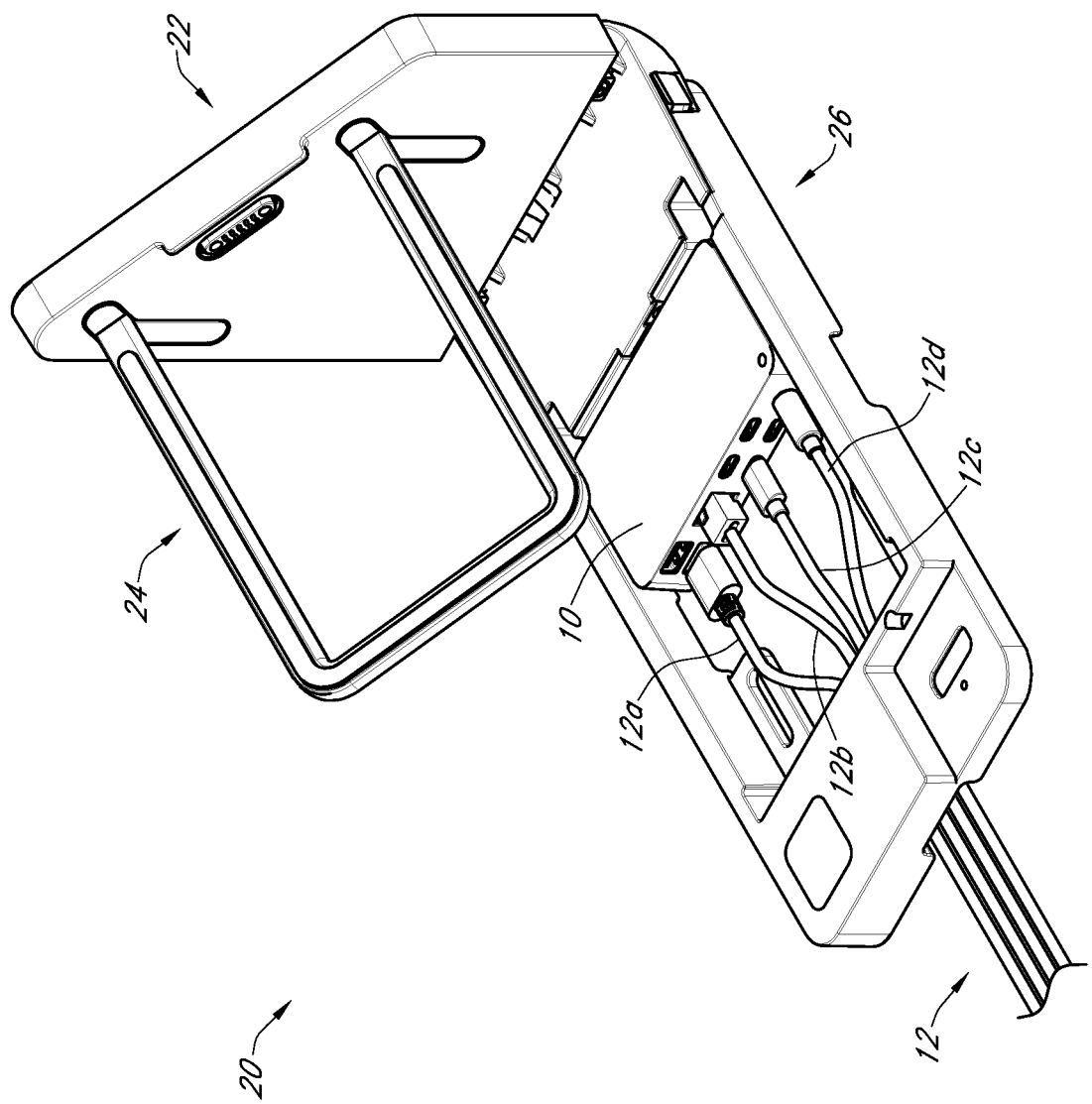
FIG. 13 is a rear-top perspective view of the hub device of FIG. 1 coupled with the stand assembly of FIG. 6 shown as a front-top perspective partial view of the stand assembly and coupled with a cable bundle.

Turning to FIG. 13, depicted therein is a rear-top perspective view of electronic hub device 10 coupled with portable electronic device stand 20 shown as a front-top perspective partial view.

Figure 14:
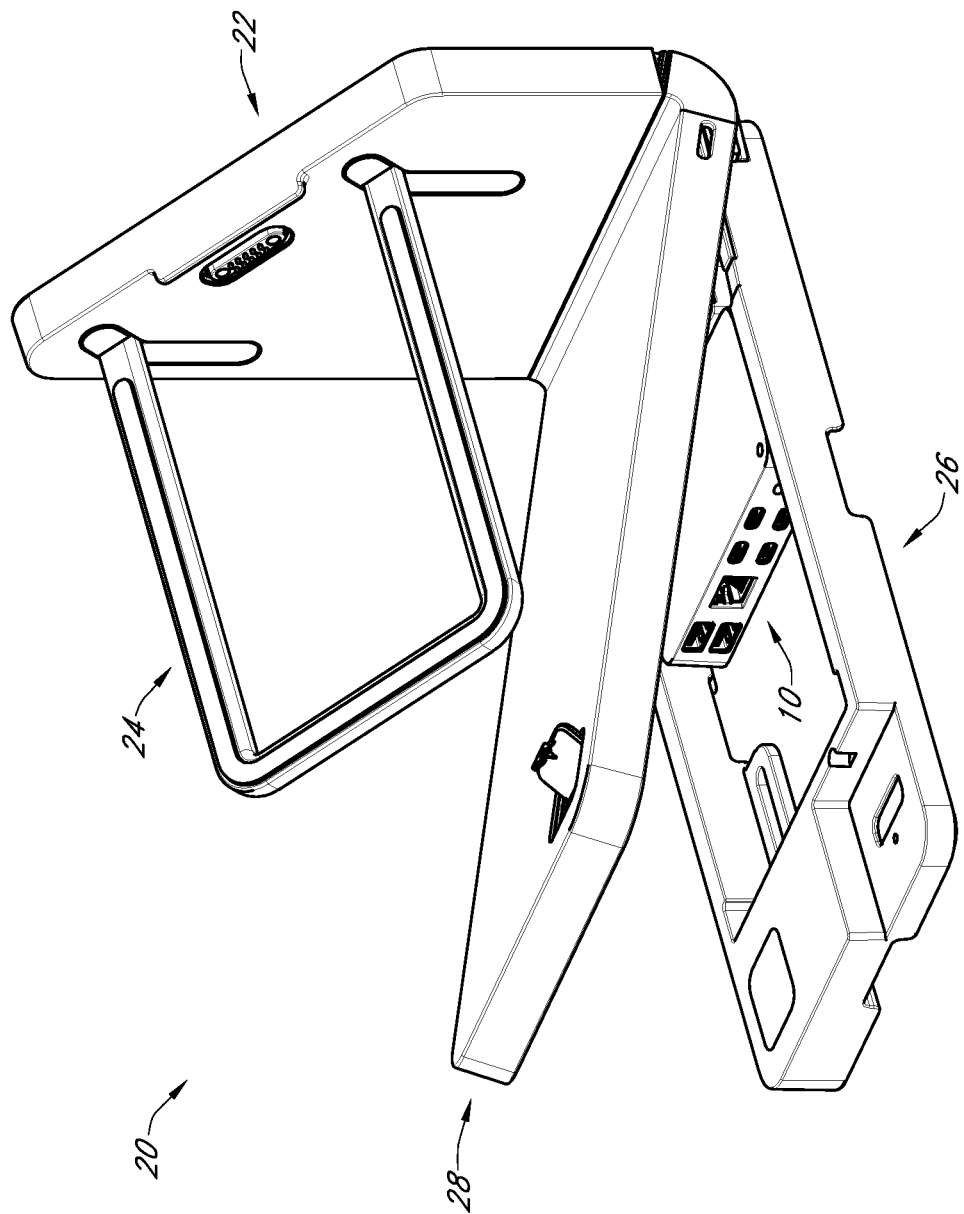
FIG. 14 is a rear-top perspective view of the hub device of FIG. 1 coupled with the stand assembly of FIG. 6 shown as a right-front-top perspective partially exploded view of the stand assembly.

Turning to FIG. 14, depicted therein is a rear-top perspective view of electronic hub device 10 coupled with portable electronic device stand 20 shown as a right-front-top perspective partially exploded view.

Figure 15:
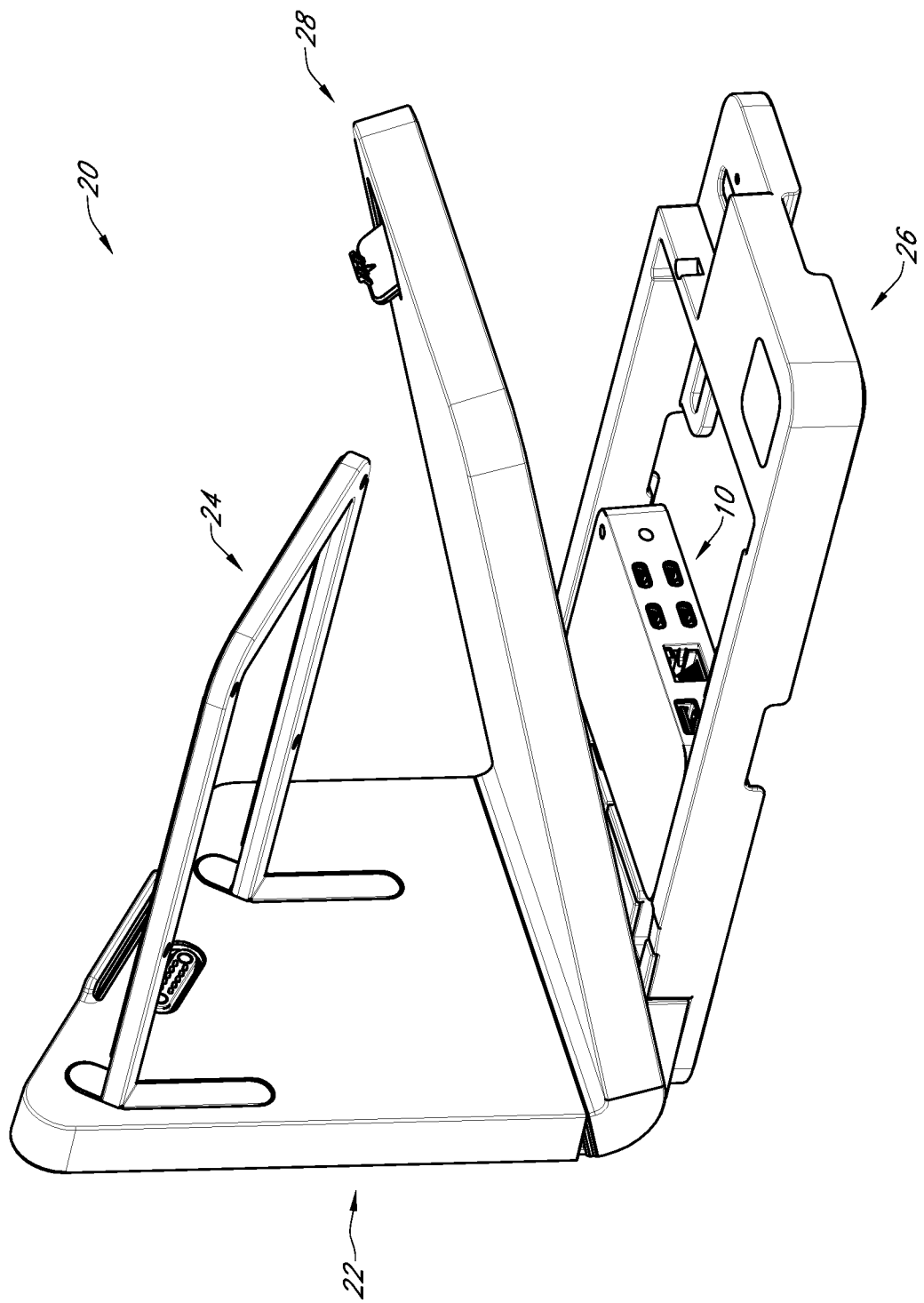
FIG. 15 is a rear-top perspective view of the hub device of FIG. 1 coupled with the stand assembly of FIG. 6 shown as a left-front-top perspective partially exploded view of the stand assembly.

Turning to FIG. 15, depicted therein is a rear-top perspective view of electronic hub device 10 coupled with portable electronic device stand 20 shown as a left-front-top perspective partially exploded view.

Figure 16:
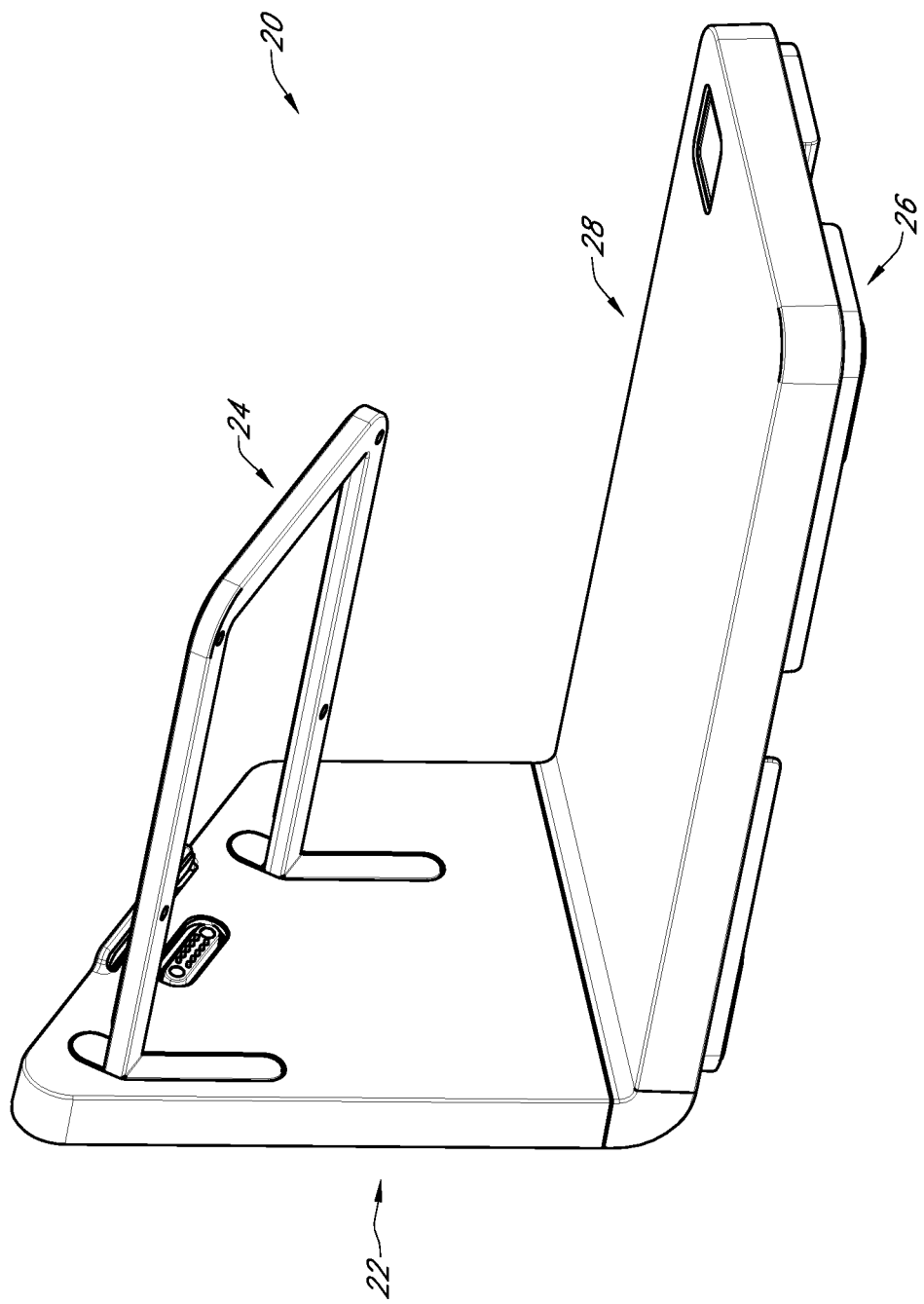
FIG. 16 is a left-front-top perspective view of the stand assembly of FIG. 6.

Turning to FIG. 16, depicted therein is a left-front-top perspective view of portable electronic device stand 20.

Figure 17:
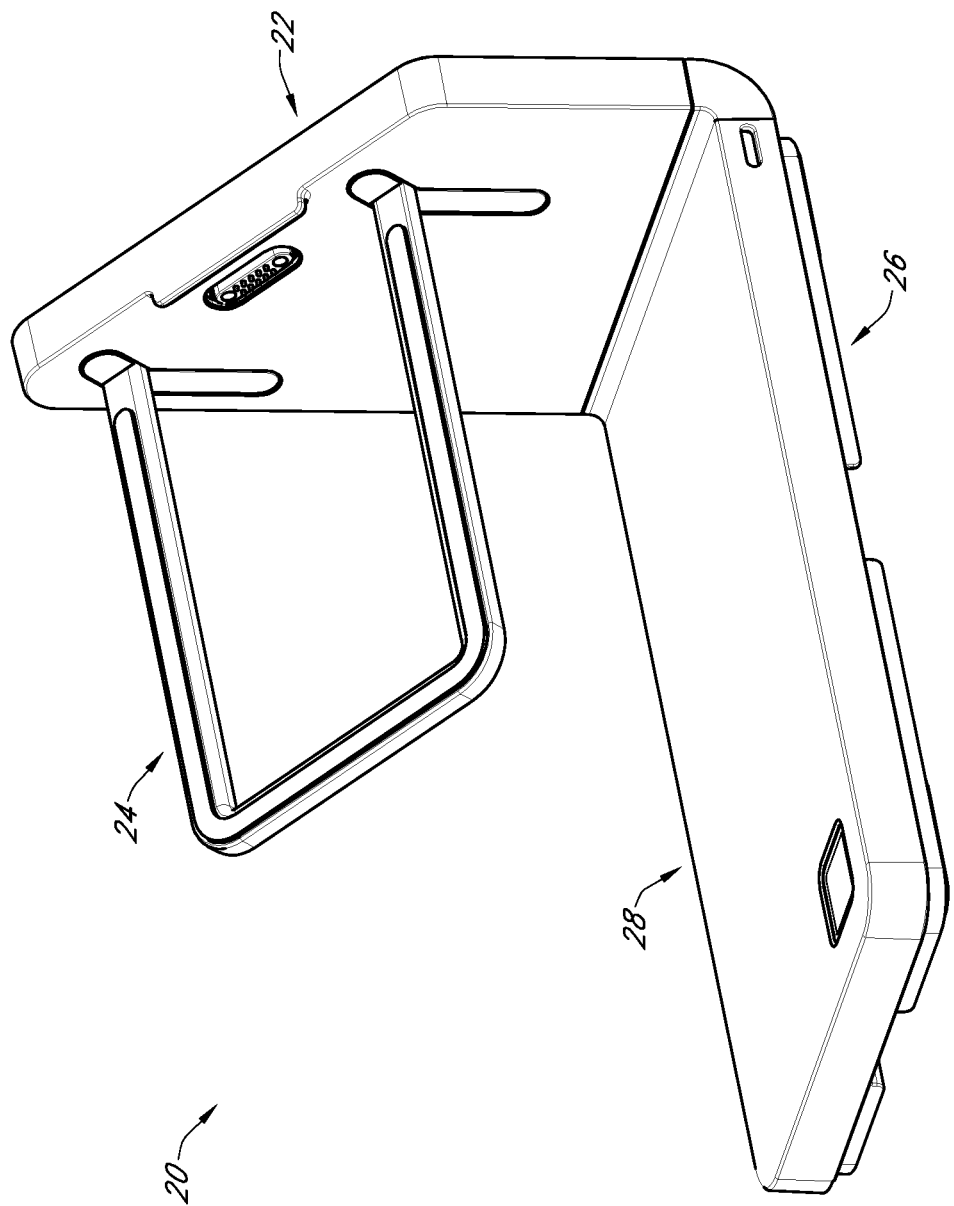
FIG. 17 is a right-front-top perspective view of the stand assembly of FIG. 6.

Turning to FIG. 17, depicted therein is a right-front-top perspective view of portable electronic device stand 20.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. An electronic hub device system for a portable electronic device, the electronic hub device system comprising:
   (I) at least one first electronic device interface port;
   (II) a first side including a first edge and a second edge, the first side extending between the first edge and the second edge;
   (III) a first exterior surface portion extending perpendicular to the first side and extending to the first edge of the first side, and
   (IV) at least one first protrusion extending away from the first side in a direction parallel to the first exterior surface portion, the at least one first protrusion being closer to the first edge of the first side than to the second edge of the first side,
   including a second side and at least one second protrusion,
   wherein the second side includes a first edge and a second edge,
   wherein the first exterior surface portion extends between the first edge of the first side and the first edge of the second side, and
   wherein the at least one second protrusion extends away from the second side in a direction parallel to the first exterior surface portion, the at least one second protrusion being closer to the first edge of the second side than to the second edge of the second side, wherein the at least one first protrusion includes an aperture with a central aperture location, wherein the at least one second protrusion includes an aperture with a central aperture location, wherein the central aperture location of the first protrusion is perpendicularly spaced away from the first side along a first linear direction, wherein the central aperture location of the second protrusion is perpendicularly spaced away from the second side along a second linear direction, and wherein the first linear direction and the second linear direction are colinear.

2. The system of claim 1
wherein the at least one first protrusion includes a first surface portion with a first elevation, and
wherein the first exterior surface portion includes an elevation equal to the first elevation of the first surface portion of the at least one first protrusion.

3. The system of claim 1
wherein the first exterior surface portion is planar,
wherein the at least one first protrusion includes a first surface portion that is planar, and
wherein the first exterior surface portion and the first surface portion of the at least one protrusion are coplanar.

4. The system of claim 1 further including at least one second electronic device interface port including an opening facing in a first direction,
wherein the at least one first electronic device interface port includes an opening facing in a second direction, and
wherein the first direction is opposite of the second direction.

5. An electronic hub device system for a portable electronic device, the electronic hub device system comprising:
(I) at least one first electronic device interface port;
(II) a first side including a first edge and a second edge, the first side extending between the first edge and the second edge;
(III) a first exterior surface portion extending perpendicular to the first side and extending to the first edge of the first side, and
(IV) at least one first protrusion extending away from the first side in a direction parallel to the first exterior surface portion, the at least one first protrusion being closer to the first edge of the first side than to the second edge of the first side
including at least one second protrusion,
wherein the at least one second protrusion extends away from the first side in a direction parallel to the first exterior surface, the at least one second protrusion being closer to the first edge of the first side than to the second edge of the first side,
wherein the first side includes a third edge perpendicular to the first edge and a fourth edge perpendicular to the first edge,
wherein the first side extends between the third edge and the fourth edge,
wherein the at least one first protrusion is located closer to the third edge than being located to the at least one second protrusion, and
wherein the at least one second protrusion is located closer to the fourth edge than being located to the at least one first protrusion.

6. The system of claim 5 further including a fastener with an elongated portion,
wherein the at least one protrusion includes an aperture shaped to receive the fastener with its elongated portion oriented with respect to a direction being parallel to the first side.

7. The system of claim 5
wherein the first exterior surface portion includes a rectangular shape.

8. A stand system for a portable electronic device, the stand system comprising:
(I) a base assembly including
(A) a lower assembly including a first exterior end, a second exterior end, a first exterior side, a second exterior side, and an interior cavity wherein the interior cavity includes a first interior end, a second interior end, a first interior side, a second interior side, an upper opening and a lower opening, and
(B) an upper assembly including an exterior face, the upper assembly being couplable with the lower assembly wherein the upper assembly covers at least the upper opening of the interior cavity of the lower assembly when the upper assembly is coupled to the lower assembly,
(II) a wall assembly including an exterior face, the wall assembly couplable to the first end of the lower assembly, and
(III) a portable electronic device support assembly extending perpendicularly with respect to the exterior face of the wall assembly.

9. The system of claim 8 wherein the lower assembly of the base assembly further includes a passageway, and
wherein the passageway runs from the interior cavity of the lower assembly through the first interior side of the interior cavity and through the first exterior side of the lower assembly.

10. The system of claim 8 wherein the lower assembly of the base assembly further includes a passageway, and
wherein the passageway runs from the interior cavity of the lower assembly through the second interior end of the interior cavity and through the second exterior end of the lower assembly.

11. The system of claim 8 further including a first electronic device interface port,
wherein the first electronic device interface port is coupled to the exterior face of the wall portion of the wall assembly.

12. The system of claim 11 further including a second electronic device interface port,
wherein the second electronic device interface port is coupled to the first interior end of the interior cavity, and
wherein the second electronic device interface port is coupled to the first electronic interface port via electrical cabling.

13. The system of claim 8
wherein the first interior side of the interior cavity includes an interior recess including at least one threaded aperture, and
wherein the second interior side of the interior cavity includes an interior recess including at least one threaded aperture.

14. A system for a portable electronic device, the system comprising:
an electronic hub device system including
(I) at least one first electronic device interface port, (II) a first side including a first edge and a second edge, the first side extending between the first edge and the second edge,
(III) a first exterior surface portion extending perpendicular to the first side and extending to the first edge of the first side, and
(IV) at least one first protrusion extending away from the first side in a direction parallel to the first exterior surface, the at least one first protrusion being closer to the first edge of the first side than to the second edge of the first side; and a stand system including
(I) a base assembly including
  (A) a lower assembly including a first exterior end, a second exterior end, a first exterior side, a second exterior side, and an interior cavity wherein the interior cavity includes a first interior end, a second interior end, a first interior side, a second interior side, an upper opening and a lower opening,
(II) a wall assembly including an exterior face, the wall assembly couplable to the first end of the lower assembly, and
(III) a portable electronic device support assembly extending perpendicularly with respect to the exterior face of the wall assembly;

wherein the electronic hub device system is couplable to the lower assembly of the base assembly of the stand system, and wherein the electronic hub device system is positioned in the interior cavity of the lower assembly when the electronic hub device system is coupled thereto.

15. The system of claim 14
wherein the at least one protrusion of the electronic hub device system includes an aperture shaped to receive a fastener elongated along an axis parallel to the first side of the electronic hub device system,
wherein the fastener couples the electronic hub device system to the lower assembly of the stand system when the electronic hub device system is coupled to the lower assembly.

16. The system of claim 14
wherein the first interior side of the interior cavity of the lower assembly of the stand system includes an interior recess including at least one threaded aperture,
wherein the at least one protrusion of the electronic hub device system includes an aperture, and
wherein the at least one protrusion is positioned in the interior recess to align the aperture of the at least one protrusion with the at least one threaded aperture of the interior recess of the first interior side of the interior cavity when the electronic hub device system is coupled to the lower assembly of the base assembly of the stand system.

17. The system of claim 14 further including a first electronic device interface port,
wherein the first electronic device interface port is coupled to the exterior face of the wall assembly.

18. The system of claim 17 further including a second electronic device interface port,
wherein the second electronic device interface port is coupled to the first end of the interior cavity of the lower assembly,
wherein the second electronic device interface port is coupled to the first electronic device interface port via electrical cabling, and
wherein the second electronic device interface port is coupled to the electronic hub device system when the electronic hub device system is coupled to the lower assembly of the base assembly of the stand system.

* * * * *